United States Patent [19]

Gottschalk et al.

[11] Patent Number: 4,895,880

[45] Date of Patent: Jan. 23, 1990

[54] PHOTOCURABLE COMPOSITIONS CONTAINING PHOTOBLEACHABLE IONIC DYE COMPLEXES

[75] Inventors: Peter Gottschalk, Centerville; Douglas C. Neckers, Perrysburg; Gary B. Schuster, Champaign, all of Ohio

[73] Assignee: The Mead Corporation, Dayton, Ohio

[21] Appl. No.: 98,358

[22] Filed: Sep. 18, 1987

Related U.S. Application Data

[63] Continuation-in-part of Ser. No. 944,305, Dec. 18, 1986, Pat. No. 4,772,530, which is a continuation-in-part of Ser. No. 860,367, May 6, 1986, abandoned, which is a continuation-in-part of Ser. No. 800,014, Nov. 20, 1985, abandoned.

[51] Int. Cl.$^4$ ................................................ C08F 8/00
[52] U.S. Cl. ........................................ 522/31; 522/50; 522/63; 427/53.1; 430/281; 430/914; 430/916; 430/927
[58] Field of Search ............... 430/270, 281, 314, 914, 430/916, 927, 339; 427/53.1; 522/63, 50, 31

[56] References Cited

U.S. PATENT DOCUMENTS 4,307,182 12/1981 Dalzell et al. ..................... 430/339

FOREIGN PATENT DOCUMENTS 0039162 10/1980 Japan .

Primary Examiner—Paul R. Michl
Assistant Examiner—Cynthia Hamilton
Attorney, Agent, or Firm—Thompson, Hine & Flory

[57] ABSTRACT

A process for coating a substrate with an essentially colorless radiation curable composition which comprises coating said substrate with a visible light sensitive composition comprising a free radical addition polymerizable or crosslinkable material and a photobleachable ionic dye-counter ion compound capable of absorbing visible light and generating free radicals; exposing said composition to light to harden said composition; and bleaching said composition to an essentially colorless state, and photohardenable compositions containing photobleachable ionic dye-counter ion compounds as photoinitiators useful in the aforesaid process.

19 Claims, No Drawings

PHOTOCURABLE COMPOSITIONS CONTAINING PHOTOBLEACHABLE IONIC DYE COMPLEXES

CROSS-REFERENCE TO RELATED APPLICATIONS

This application is a continuation-in-part of U.S. application Ser. No. 944,305, filed Dec. 18, 1986 which in turn is a continuation-in-part of Ser. No. 860,367, filed May 6, 1986, abandoned, which is a continuation-in-part of Ser. No. 800,014, filed Nov. 20, 1985, abandoned.

BACKGROUND OF THE INVENTION

The aforementioned related application, which corresponds to European Application Publication No. 0233587, relates to photocurable compositions containing ionic dye complexes as photoinitiators. These complexes are characterized in that they directly or indirectly yield free radicals upon exposure to actinic radiation and particularly visible light.

By nature, compositions which are sensitive to visible light appear colored to the human eye. There are applications in which it would be desirable to use the compositions which can be cured upon exposure to visible light but for the colored appearance of these compositions. For example, in laminating glass, if the composition is colored it imparts a tint to the glass which may be undesirable. Similarly, a visible initiator would be advantageous in coating optical fibers but for its colored appearance. In these applications, photobleachable ionic dye complexes would be particularly useful. In some of the compositions disclosed in the related application, the dye has been observed to be photobleachable.

SUMMARY OF THE INVENTION

The present invention particularly relates to visible light sensitive photocurable compositions containing a photobleachable ionic dye complex as an initiator.

Another manifestation of the present invention is a process for coating a substrate with a visible light curable composition wherein the process is characterized in that the composition contains a photobleachable ionic dye complex as a photoinitiator.

The compositions and process of the present invention are useful in applications in which essentially colorless (e.g., clear, transparent or white) radiation cured coatings are desired. Typical examples of such applications are in laminating glass, coating optical fibers or in coating compositions containing white pigments such as titanium dioxide.

DETAILED DESCRIPTION OF THE INVENTION

The ionic dye complexes used in the present invention are generally described in U.S. Pat. No. 4,772,530. Xanthane dye complexes are more particularly described in commonly assigned U.S. application Ser. No. 057,544, filed June 3, 1987.

The ionic dye complexes used in the present invention are characterized in that they are photobleachable.

The polymerizable or crosslinkable materials described in the aforementioned applications are useful herein. The photoinitiator systems described in the aforementioned applications are also useful herein with the requirement that the ionic dye-counter ion compounds be photobleachable. Of the dye complexes disclosed in U.S. application Ser. No. 944,305 corresponding to European Application Publication No. 0233587, all of the cyanine dye complexes are photobleachable with varying efficiency and speed. Some of the more efficient photobleachable complexes are:

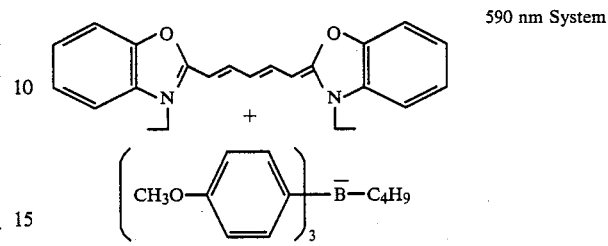

590 nm System

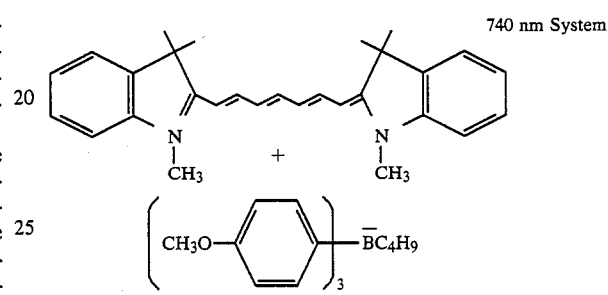

740 nm System

The azine dye complex of Methylene Blue and triphenylbutylborate is one of the most efficient complexes in terms of photobleachability. Its structure is

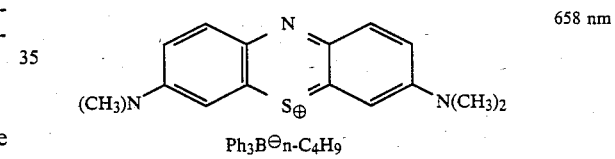

658 nm

Rose Bengal-onium dye complexes are also photobleachable. Of these complexes of Rose Bengal and its benzylester with diphenyliodonium ions (including di(4-t-butylphenyl)iodonium ions) are photobleachable with high efficiency.

Herein, the photobleachable dye complexes may bleach upon exposure to visible light upon curing the compositions, or they may be bleached upon post-exposure to a bleaching radiation such as ultraviolet radiation.

Having described the invention in detail and by reference to preferred embodiments thereof, it will be apparent that modifications and variations are possible without departing from the scope of the invention defined in the appended claims.

What is claimed is:

1. A visible-light sensitive photohardenable composition comprising a free radical addition polymerizable or crosslinkable material and a photobleachable ionic dye-counter ion compound, said compound being capable of absorbing visible light and producing free radicals which initiate polymerization or crosslinking of said material.

2. The photohardenable composition of claim 1 wherein prior to exposure, said ionic dye-counter ion compound is a stable, non-transient compound.

3. The photohardenable composition of claim 1 wherein said ionic dye-counter ion compound is soluble in said free radical addition polymerizable or crosslinked compound.

4. The photohardenable composition of claim 3 wherein following exposure of said ionic dye-counter ion compound to light, an electron is transferred from said dye to said counter ion or from said counter ion to said dye and the rate of said electron transfer is greater than a diffusion controlled rate.

5. The photohardenable composition of claim 1 wherein said compound is an anionic dye compound.

6. The photohardenable composition of claim 5 wherein said anionic dye is selected from the group consisting of xanthene and oxonol dyes.

7. The photohardenable composition of claim 6 wherein said ionic dye counter ion compound is an anionic dye-onium ion complex or an anionic dye-pyryllium ion complex.

8. The photohardenable composition of claim 7 wherein said dye is a xanthene dye.

9. The photohardenable composition of claim 1 wherein said ionic dye counter ion compound is a cationic dye-borate anion compound represented by the formula (I):

 (I)

where D is a cationic dye moiety; and $R^1$, $R^2$, $R^3$ and $R^4$ are the same or different and selected from the group consisting of alkyl, aryl, aralkyl, alkaryl, alkenyl, alkynyl, alicyclic, heterocyclic, and allyl groups.

10. The photohardenable composition of claim 9 wherein said cationic dye is selected from the group consisting of cationic methine, polymethine, triarylmethane, indoline, azine, thiazine, xanthene, oxazine, and acridine dyes.

11. The photohardenable composition of claim 10 wherein said cationic dye is selected from the group consisting of cationic cyanine, carbocyanine, hemicyanine, rhodamine, and azamethine dyes.

12. The photohardenable composition of claim 11 wherein said polymerizable or crosslinkable material contains an ethylenically unsaturated compound.

13. The photohardenable composition of claim 12 wherein at least one of $R^1$, $R^2$, $R^3$ and $R^4$ is an alkyl group.

14. The photohardenable composition of claim 13 wherein $R^1$, $R^2$, and $R^3$ are aryl groups and $R^4$ is an alkyl group.

15. The photohardenable composition of claim 7 wherein said photobleachable ionic dye-counter ion compound is a complex of Rose Bengal or Rose Bengal benzyl ester with a diphyliodonium ions.

16. The photohardenable composition of claim 9 wherein said cationic dye is an azine dye.

17. The photohardenable composition of claim 16 wherein said azine dye is Methylene Blue.

18. The photohardenable composition of claim 16 wherein said cationic dye is selected from the group consisting of

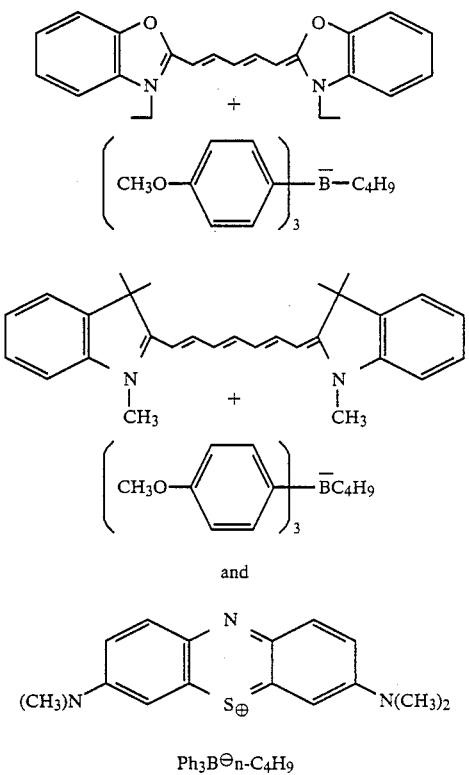

19. A process for coating a substrate with an essentially colorless radiation curable composition which comprises coating said substrate with a visible light sensitive composition comprising a free radical addition polymerizable or crosslinkable material and a photobleachable ionic dye-counter ion compound capable of absorbing visible light and generating free radicals; exposing said composition to light to harden said composition; and bleaching said ionic dye to an essentially colorless state.

* * * * *